United States Patent
Takei (10) Patent No.: US 10,096,749 B2
(45) Date of Patent: Oct. 9, 2018

(54) ILLUMINATION LIGHT SOURCE, ILLUMINATION APPARATUS, OUTDOOR ILLUMINATION APPARATUS, AND VEHICLE HEADLIGHT

(71) Applicant: PANASONIC INTELLECTUAL PROPERTY MANAGEMENT CO., LTD., Osaka (JP)

(72) Inventor: Naoko Takei, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 191 days.

(21) Appl. No.: 15/184,244

(22) Filed: Jun. 16, 2016

(65) Prior Publication Data

US 2016/0377240 A1 Dec. 29, 2016

(30) Foreign Application Priority Data

Jun. 26, 2015 (JP) ................................. 2015-128916

(51) Int. Cl.
*H01L 33/50* (2010.01)
*F21S 41/141* (2018.01)
(Continued)

(52) U.S. Cl.
CPC .......... *H01L 33/502* (2013.01); *F21S 41/141* (2018.01); *H01L 25/0753* (2013.01); *H01L 33/504* (2013.01); *F21S 8/026* (2013.01); *F21S 8/085* (2013.01); *F21V 15/01* (2013.01); *F21V 29/77* (2015.01); *F21V 29/773* (2015.01); *F21V 29/89* (2015.01); *F21W 2131/10* (2013.01); *F21W 2131/103* (2013.01); *F21Y 2115/10* (2016.08); *H01L 2224/48091* (2013.01);
(Continued)

(58) Field of Classification Search
None
See application file for complete search history.

(56) References Cited

U.S. PATENT DOCUMENTS

| 2006/0226759 A1* | 10/2006 | Masuda | ............. | C09K 11/0883 |
| | | | | 313/486 |
| 2009/0160330 A1* | 6/2009 | Hsu | ..................... | H01L 25/0753 |
| | | | | 313/506 |

(Continued)

FOREIGN PATENT DOCUMENTS

| JP | 2011-072388 A | 4/2011 |
| JP | 2013-101881 A | 5/2013 |

(Continued)

*Primary Examiner* — Sharon Payne
(74) *Attorney, Agent, or Firm* — McDermott Will & Emery LLP (57) ABSTRACT

An illumination light source emits white light resulting from mixing of light emitted from an LED chip and light emitted from a plurality of phosphors. A light emission spectrum of the white light has a peak in a wavelength range from 430 nm to 460 nm. In the light emission spectrum, a proportion of optical intensity at a wavelength of 510 nm relative to optical intensity at the peak is 0.45 or more, and a proportion of optical intensity at a wavelength of 580 nm relative to the optical intensity at the peak is 0.60 or more. Furthermore, in the light emission spectrum, a proportion of optical intensity at a wavelength of 650 nm relative to the optical intensity at the wavelength of 580 nm is 0.4 or less.

12 Claims, 10 Drawing Sheets

(51) Int. Cl.
*F21V 15/01* (2006.01)
*F21V 29/77* (2015.01)
*H01L 25/075* (2006.01)
*F21S 8/02* (2006.01)
*F21S 8/08* (2006.01)
*F21W 131/10* (2006.01)
*F21W 131/103* (2006.01)
*F21V 29/89* (2015.01)
*F21Y 115/10* (2016.01)

(52) U.S. Cl.
CPC ............... *H01L 2224/48137* (2013.01); *H01L 2924/181* (2013.01)

(56) References Cited

U.S. PATENT DOCUMENTS

| | | |
|---|---|---|
| 2013/0114283 A1 | 5/2013 | Kawanobe et al. |
| 2013/0234584 A1* | 9/2013 | Hattori ............... C09K 11/7734 313/503 |
| 2014/0268856 A1 | 9/2014 | Kawanobe et al. |
| 2014/0376229 A1 | 12/2014 | Tsumori et al. |

FOREIGN PATENT DOCUMENTS

| | | |
|---|---|---|
| JP | 2013-239240 A | 11/2013 |
| JP | 2014-026837 A | 2/2014 |
| JP | 2014-075186 A | 4/2014 |
| JP | 2015-008061 A | 1/2015 |

\* cited by examiner

| | PROPORTION OF OPTICAL INTENSITY (510 nm / PEAK WAVELENGTH) | PROPORTION OF OPTICAL INTENSITY (580 nm / PEAK WAVELENGTH) | PROPORTION OF OPTICAL INTENSITY (650 nm / 580 nm) | Ra | S/P RATIO | CORRELATED COLOR TEMPERATURE [K] | CHARACTERISTICS |
|---|---|---|---|---|---|---|---|
| EXAMPLE 1 | 0.49 | 0.60 | 0.34 | 80 | 2.2 | 6000 | - GOOD BRIGHTNESS WITH CENTRAL VISION AND PERIPHERAL VISION<br>- HIGH COLOR REPRODUCIBILITY |
| EXAMPLE 2 | 0.52 | 0.68 | 0.35 | 80 | 2.1 | 5500 | - GOOD BRIGHTNESS WITH CENTRAL VISION AND PERIPHERAL VISION<br>- HIGH COLOR REPRODUCIBILITY |
| EXAMPLE 3 | 0.58 | 0.80 | 0.37 | 80 | 2.0 | 5000 | - GOOD BRIGHTNESS WITH CENTRAL VISION AND PERIPHERAL VISION<br>- HIGH COLOR REPRODUCIBILITY |
| COMPARATIVE EXAMPLE 1 | — | — | — | 58 | 2.9 | 5500 | - INSUFFICIENT BRIGHTNESS WITH CENTRAL VISION<br>- LOW COLOR REPRODUCIBILITY |
| COMPARATIVE EXAMPLE 2 | 0.27 | 0.66 | 0.40 | 70 | 1.7 | 5000 | - INSUFFICIENT BRIGHTNESS WITH PERIPHERAL VISION |
| COMPARATIVE EXAMPLE 3 | 0.53 | 0.65 | 0.83 | 90 | 2.0 | 5000 | - INSUFFICIENT BRIGHTNESS WITH CENTRAL VISION |

FIG. 14 though the illuminating light is perceived as bright with peripheral vision. In addition, such illuminating light has a problem of low color reproducibility.

ILLUMINATION LIGHT SOURCE, ILLUMINATION APPARATUS, OUTDOOR ILLUMINATION APPARATUS, AND VEHICLE HEADLIGHT

CROSS REFERENCE TO RELATED APPLICATION

This application claims the benefit of priority of Japanese Patent Application Number 2015-128916 filed on Jun. 26, 2015, the entire content of which is hereby incorporated by reference.

BACKGROUND

1. Technical Field

The present disclosure relates to an illumination light source for use in an outdoor illumination apparatus or a vehicle headlight, and to an illumination apparatus for outdoor use or vehicle headlight use.

2. Description of the Related Art

Illumination apparatuses which use light-emitting diodes (LEDs) are conventionally used.

In order that illuminating light emitted from the illumination apparatuses is perceived as bright, under a photopic environment, photopic luminance of the illuminating light may be increased. In this regard, in order that the illuminating light is perceived as bright under a mesopic environment such as night street spaces and night road spaces, scotopic luminance also needs to be considered. Japanese Unexamined Patent Application Publication No. 2013-101881 discloses an illumination apparatus (a vehicle headlight) which emits illuminating light that is perceived as bright with peripheral vision under a mesopic environment, by increasing the S/P (scotopic/photopic) ratio which is a ratio of a scotopic luminous flux to a photopic luminous flux.

SUMMARY

In the illumination apparatus disclosed in Japanese Unexamined Patent Application Publication No. 2013-101881, an LED that emits blue-green light, an LED that emits red light, and a green phosphor are combined in such a way that blue-green light is emphasized to increase the S/P ratio of illuminating light. Since the photopic luminance of such illuminating light is low, there is a concern that brightness of the illuminating light with central vision is insufficient although the illuminating light is perceived as bright with peripheral vision. In addition, such illuminating light has a problem of low color reproducibility.

In view of this, the present disclosure provides an illumination light source and an illumination apparatus which emit light that is perceived as bright both with peripheral vision and central vision under a mesopic environment and has improved color reproducibility.

An illumination light source according to an aspect of the present disclosure includes: a light-emitting element; and a plurality of phosphors each of which is excited by light emitted from the light-emitting element and emits light having a wavelength different from a wavelength of the light emitted from the light-emitting element, wherein the illumination light source emits white light resulting from mixing of the light emitted from the light-emitting element and the light emitted from the plurality of phosphors, a light emission spectrum of the white light has a peak in a wavelength range from 430 nm to 460 nm, in the light emission spectrum, a proportion of optical intensity at a wavelength of 510 nm relative to optical intensity at the peak is 0.45 or more, a proportion of optical intensity at a wavelength of 580 nm relative to the optical intensity at the peak is 0.60 or more, and a proportion of optical intensity at a wavelength of 650 nm relative to the optical intensity at the wavelength of 580 nm is 0.4 or less, a correlated color temperature of the white light is in a range from 4500 K to 7000 K, and an average color rendering index Ra of the white light is 70 or more.

An illumination apparatus according to an aspect of the present disclosure includes: the illumination light source described above; and a lighting apparatus that supplies the illumination light source with electric power for lighting the illumination light source.

The illumination light source and the illumination apparatus in the present disclosure are capable of emitting light that is perceived as bright both with peripheral vision and central vision and has improved color reproducibility.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, an illumination light source and an illumination apparatus according to embodiments are described with reference to the Drawings Note that each of the embodiments described below shows a general or specific example. The numerical values, shapes, materials, structural elements, the arrangement and connection of the structural elements, etc., shown in the following embodiments are mere examples, and are not intended to limit the scope of the present disclosure. As such, among the structural elements in the following embodiments, those not recited in any one of the independent claims which indicate the broadest inventive concepts are described as arbitrary structural elements.

Furthermore, the respective figures are schematic illustrations and are not necessarily precise illustrations. Additionally, substantially identical elements are assigned the same reference signs, and there are cases where overlapping descriptions are omitted or simplified.

Embodiment 1

Configuration of Illumination Light Source

Figure 1:
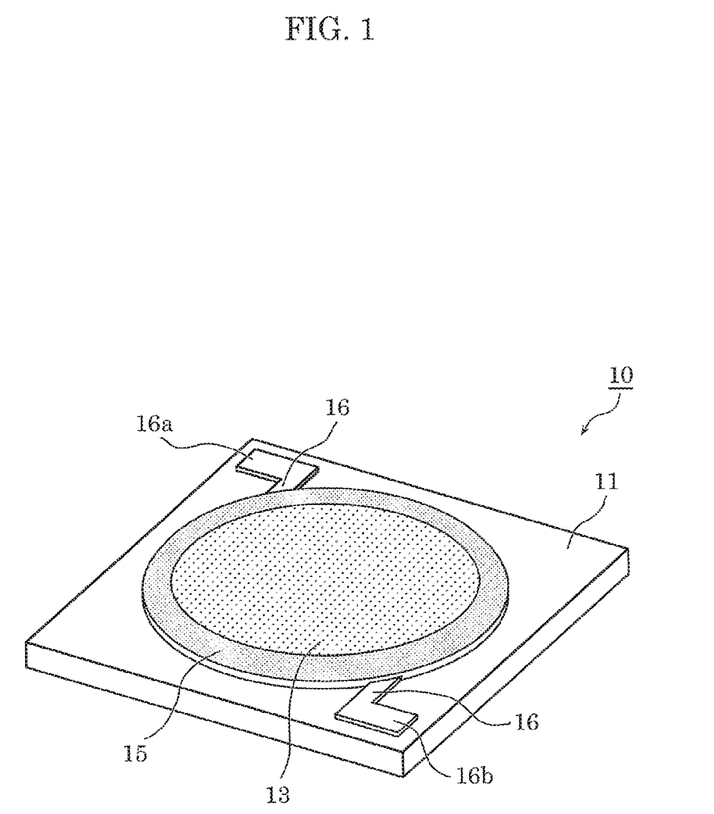
FIG. 1 is a perspective view of an external appearance of an illumination light source according to Embodiment 1.
Figure 2:
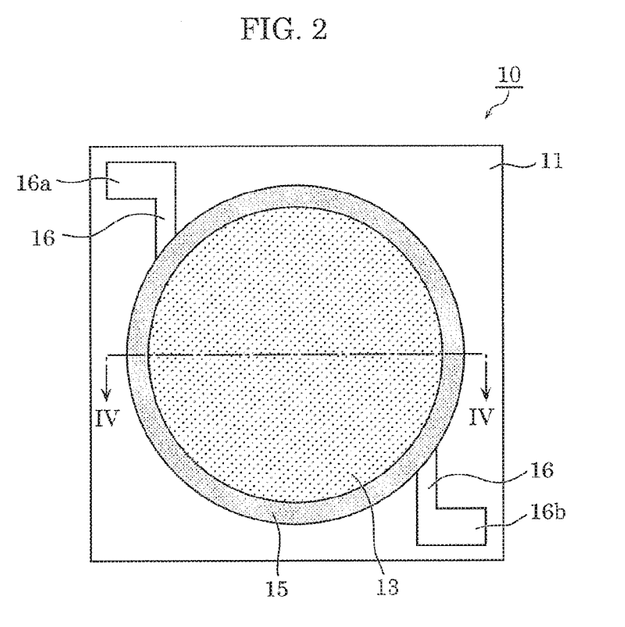
FIG. 2 is a plan view of an illumination light source according to Embodiment 1.
Figure 3:
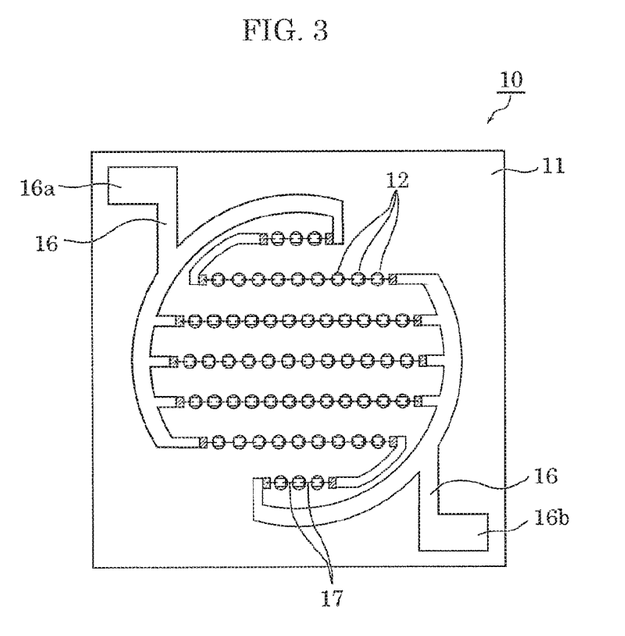
FIG. 3 is a plan view illustrating the internal structure of an illumination light source according to Embodiment 1.
Figure 4:
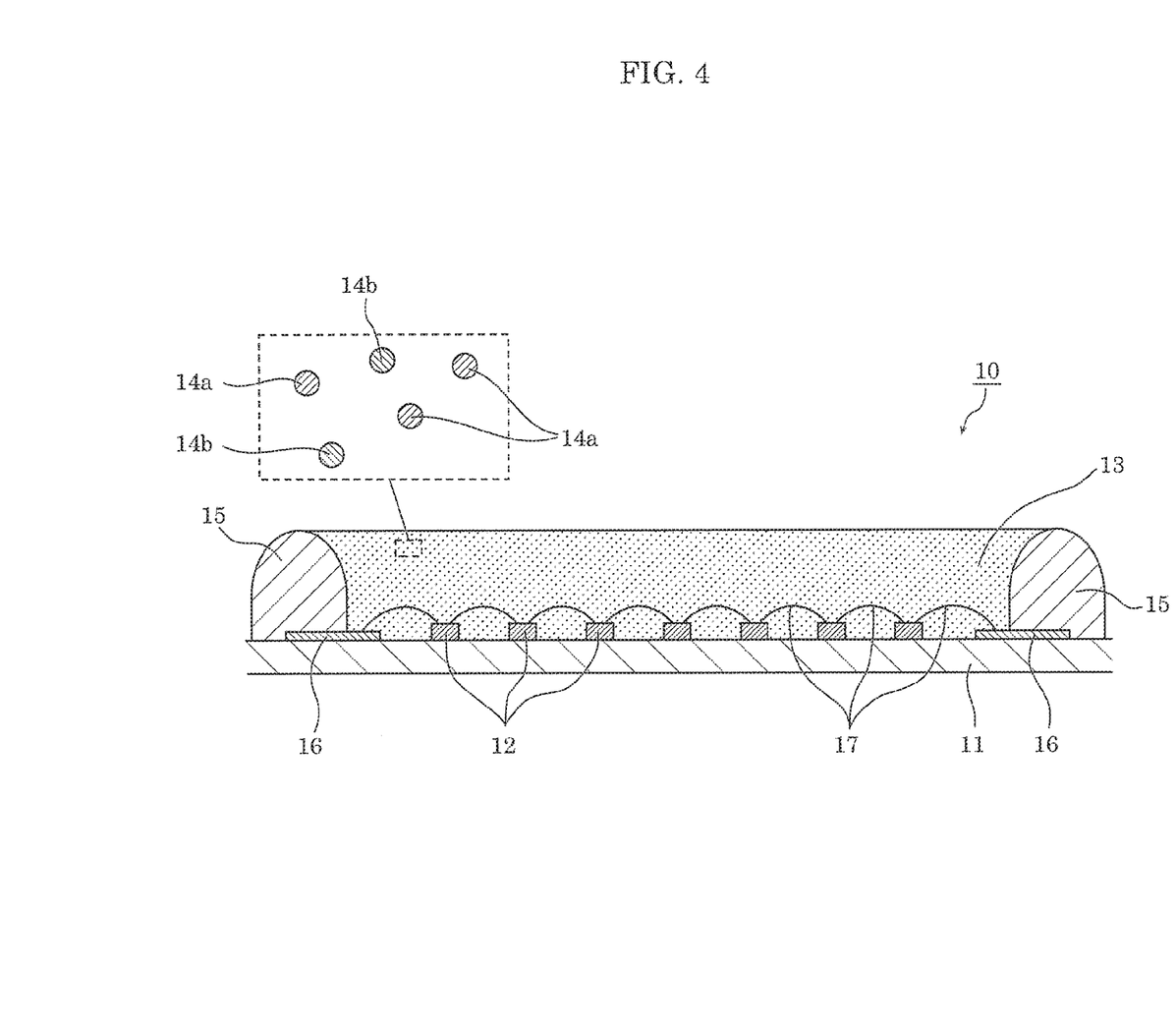
FIG. 4 is a schematic cross-sectional view of an illumination light source, taken along line IV-IV in FIG. 2.

First, the configuration of the illumination light source according to Embodiment 1 will be described with reference to the Drawings. FIG. 1 is a perspective view of an external appearance of an illumination light source according to Embodiment 1. FIG. 2 is a plan view of an illumination light source according to Embodiment 1. FIG. 3 is a plan view illustrating the internal structure of an illumination light source according to Embodiment 1. FIG. 4 is a schematic cross-sectional view of an illumination light source, taken along line IV-IV in FIG. 2. Note that the above-mentioned FIG. 3 is a plan view of the illumination light source which corresponds to that illustrated in FIG. 2 and illustrates the internal structure thereof including the arrangement of LED chips 12 and a wiring pattern with sealing member 13 and dam member (side sealing member) 15 removed. It should also be noted that since FIG. 4 is a schematic cross-sectional view, FIG. 4 does not completely match FIG. 2 in terms of the number of LED chips 12 and so on.

Illumination light source 10 according to Embodiment 1 includes substrate 11, two or more LED chips 12, sealing member 13, and dam member 15 as illustrated in FIG. 1 to FIG. 4.

Illumination light source 10 is what is called a COB (chip-on-board) LED module in which LED chips 12 are directly mounted on substrate 11. Illumination light source 10 is capable of emitting white light that is perceived as bright with central vision and peripheral vision under a mesopic environment as described later. Therefore, illumination light source 10 is suitable for an illumination apparatus used in an environment with dark surroundings, such as outdoor at night. Although illumination light source 10 is used primarily for an outdoor illumination apparatus or a vehicle headlight, it may be used for an indoor illumination apparatus.

Substrate 11 has a wiring region on which wiring 16 is provided. Note that wiring 16 (together with electrode 16a and electrode 16b) is metal wiring for supplying electric power to LED chips 12. Substrate 11 is, for example, a metal-based substrate or a ceramic substrate. Furthermore, substrate 11 may be a resin substrate that uses a resin as a base material.

An alumina substrate made of aluminum oxide (alumina), an aluminum nitride substrate made of aluminum nitride, or the like is used as the ceramic substrate. An aluminum alloy substrate, an iron alloy substrate, a copper alloy substrate, or the like, the surface of which is coated with an insulating film, for example, is used as the metal-based substrate. A glass-epoxy substrate made of glass fiber and an epoxy resin is used as the resin substrate, for example.

Note that a substrate having a high optical reflectivity (for example, an optical reflectivity of 90% or higher), for example, may be used as substrate 11. Using a substrate having a high optical reflectivity as substrate 11 allows light emitted by LED chips 12 to be reflected off the surface of substrate 11. This results in an increase in the light extraction rate of illumination light source 10. Examples of the substrate include a white ceramic substrate that uses alumina as a base material.

Alternatively, a light-transmissive substrate having high light transmittance may be used as substrate 11. Examples of the substrate include a light-transmissive ceramic substrate made of polycrystalline alumina or aluminum nitride, a clear glass substrate made of glass, a crystal substrate made of crystal, a sapphire substrate made of sapphire, or a transparent resin substrate made of a transparent resin material.

Note that substrate 11 has a rectangular shape in Embodiment 1, but may have a circular or other shape.

LED chip 12 is one example of the light-emitting element and is a blue LED chip which emits blue light. For example, a gallium nitride LED chip formed using an InGaN-based material and having a center wavelength (a peak wavelength of the light emission spectrum) in the range from 430 nm to 460 nm is used as LED chip 12.

Such LED chip 12 is more efficient than that used in the illumination apparatus in Japanese Unexamined Patent Application Publication No. 2013-101881, that is, a blue-green LED chip having a peak wavelength of 480 nm. Furthermore, since only one type of LED chip, that is, LED chip 12, is used in illumination light source 10, a lighting circuit (a power supply circuit) therein is simpler than that in an illumination light source including two or more types of LED chips.

A plurality of light-emitting element lines including two or more LED chips 12 are provided on substrate 11. From the structural perspective, seven light-emitting element lines are provided on substrate 11 in such a way as to be fit within the shape of a circle as illustrated in FIG. 3.

From the electrical perspective, five light-emitting element lines each including 12 LED chips 12 connected in series are provided on substrate 11. These five light-emitting element lines are connected in parallel and emit light with electric power supplied between electrode 16a and electrode 16b.

Although details are not illustrated in the Drawings, LED chips 12 are connected to each other in series in a chip-to-chip configuration mainly by bonding wire 17 (some of LED chips 12 are connected by wiring 16). Bonding wire 17 is a power supply wire connected to LED chips 12. For example, gold (Au), silver (Ag), copper (Cu), or the like is used as a metal material of bonding wire 17 as well as a metal material of wiring 16, electrode 16a, and electrode 16b mentioned above.

Dam member 15 is provided on substrate 11 and serves to block sealing member 13. For example, a thermosetting resin or a thermoplastic resin having an insulating property is used as dam member 15. More specifically, a silicone resin, a phenol resin, an epoxy resin, a BT (bismaleimide-triazine) resin, PPA (polyphthalamide), or the like is used as dam member 15.

It is desirable that dam member 15 have a light-reflecting property in order to increase the light extraction rate of illumination light source 10. Thus, a resin in a white color (what is called a white resin) is used as dam member 15 in Embodiment 1. Note that in order to increase the light-reflecting property of dam member 15, $TiO_2$, $Al_2O_3$, $ZrO_2$, MgO, and the like particles may be contained in dam member 15.

In illumination light source 10, dam member 15 is formed in a circular annular shape so as to surround two or more LED chips 12 in a top view. Sealing member 13 is provided in a region surrounded by dam member 15. With this, it is possible to increase the light extraction rate of illumination light source 10. The outer shape of dam member 15 may be a rectangular annular shape.

Sealing member 13 seals two or more LED chips 12, bonding wire 17, and part of wiring 16. Specifically, sealing member 13 is formed of a light-transmissive resin material containing two or more green phosphors 14a and two or more red phosphors 14b as wavelength converting elements. As the light-transmissive resin material, a methyl-based silicone resin is used in Embodiment 1, but an epoxy resin, a urea resin, or the like may be used.

Green phosphor 14a is one example of a phosphor (phosphor particles) and is excited by the blue light emitted from LED chip 12 and produces green fluorescence which is light having a wavelength different from the wavelength of the blue light emitted from LED chip 12. Specifically, a $Lu_3Al_5O_{12}:Ce^{3+}$ phosphor having a center wavelength of fluorescence in the range from 540 nm to 550 nm is used as green phosphor 14a.

As described later, illumination light source 10 is characterized by an increased S/P ratio of white light which illumination light source 10 emits. In order to increase the S/P ratio, increasing components of blue green light in the wavelength range from 480 nm to 520 nm is effective. Furthermore, in order to increase the components in such a range of blue green light, a $Lu_3Al_5O_{12}:Ce^{3+}$ phosphor is effective from the perspective of high wavelength conversion efficiency.

When the $Lu_3Al_5O_{12}:Ce^{3+}$ phosphor is used, a center wavelength of fluorescence of less than 540 nm leads to a decrease in the wavelength conversion efficiency while a center wavelength of fluorescence of more than 550 nm leads to a decrease in the effect of increasing the components in the above range of blue green light, that is, the effect of increasing the S/P ratio. Therefore, the $Lu_3Al_5O_{12}:Ce^{3+}$ phosphor having a center wavelength of fluorescence in the range from 540 nm to 550 nm is used in Embodiment 1.

Note that so long as a decrease in the light conversion efficiency is permitted, any phosphor in the range in which the later-described light emission spectrum can be obtained may be used as green phosphor 14a. For example, an yttrium aluminum garnet (YAG)-based phosphor may be used as green phosphor 14a.

Red phosphor 14b is one example of the phosphor and is excited by the light emitted from LED chip 12 and produces red fluorescence which is light having a wavelength different from the wavelength of the blue light emitted from LED chip 12. Specifically, a $(Sr, Ca)AlSiN_3:Eu^{2+}$ phosphor having a center wavelength of fluorescence in the range from 610 nm to 620 nm is used as red phosphor 14b. Note that any phosphor may be used as red phosphor 14b so long as the later-described light emission spectrum can be obtained.

The configuration described above allows a portion of the blue light emitted from LED chips 12 is converted by green phosphor 14a contained in sealing member 13, so that the portion is transformed into green light. Likewise, another portion of the blue light emitted from LED chips 12 is converted by red phosphor 14b contained in sealing member 13, so that the portion is transformed into red light. Then, the blue light not absorbed by green phosphor 14a and red phosphor 14b, the green light resulting from the wavelength conversion by green phosphor 14a, and the red light resulting from the wavelength conversion by red phosphor 14b are diffused and mixed within sealing member 13. Consequently, white light is emitted from sealing member 13. This means that illumination light source 10 emits white light resulting from mixing of the light emitted from LED chip 12, the light emitted from green phosphor 14a, and the light emitted from red phosphor 14b.

The following describes Examples 1 to 3 and Comparative Examples 1 to 3 of light emission spectra of the white light which illumination light source 10 emits.

Example 1

Figure 5:
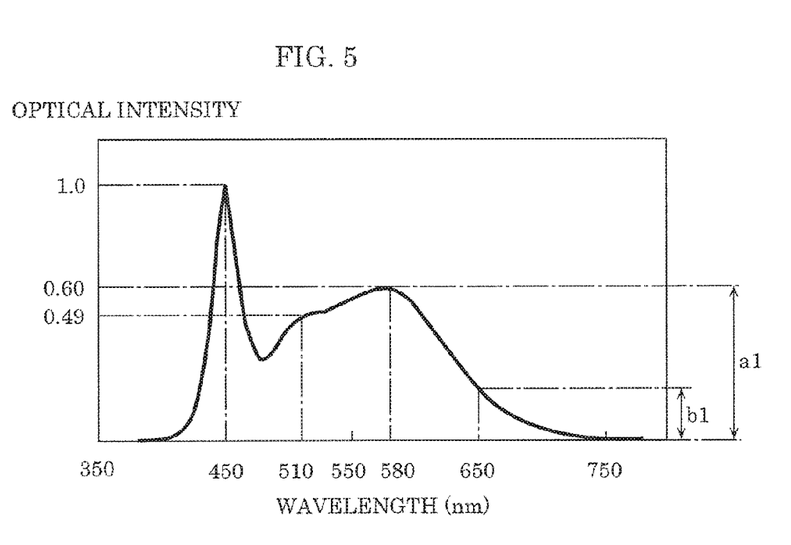
FIG. 5 illustrates a light emission spectrum of an illumination light source according to Example 1.

FIG. 5 illustrates a light emission spectrum of illumination light source 10 according to Example 1. Note that the vertical axis in FIG. 5 represents normalized optical intensity where light having a wavelength of 450 nm has optical intensity of 1.0 in the light emission spectrum.

Illumination light source 10 according to Example 1 includes LED chip 12 having a light emission peak at a wavelength of 450 nm, green phosphor 14a ($Lu_3Al_5O_{12}:Ce^{3+}$ phosphor) having a light emission peak at a wavelength of 545 nm, and red phosphor 14b having a light emission peak at a wavelength of 615 nm ($(Sr, Ca)AlSiN_3:Eu^{2+}$ phosphor). In illumination light source 10 according to Example 1, an amount of mixture of green phosphor 14a and red phosphor 14b is adjusted so that the white light emitted from illumination light source 10 has a correlated color temperature of 6000 K. Thus, the correlated color temperature of the white light which illumination light source 10 according to Example 1 emits is 6000 K.

As illustrated in FIG. 5, the proportion of the optical intensity at a wavelength of 510 nm relative to the optical intensity at the peak of the light emission spectrum (a wavelength of 450 nm) is 0.49, the proportion of the optical intensity at a wavelength of 580 nm relative to the optical intensity at the peak of the light emission spectrum is 0.60, and the proportion of the optical intensity at a wavelength of 650 nm relative to the optical intensity at the wavelength of 580 nm (b1/a1 in FIG. 5) is 0.34.

Furthermore, the light emission spectrum of illumination light source 10 according to Example 1 has a second peak at the wavelength of 580 nm. The second peak means the next highest optical intensity after the above-mentioned peak.

Average color rendering index Ra of the white light which illumination light source 10 according to Example 1 emits is 80. The S/P ratio, which is a ratio of a scotopic luminous flux to a photopic luminous flux, of the white light which illumination light source 10 according to Example 1 emits is 2.2.

Note that the S/P ratio is an evaluation index of visibility under a mesopic environment. The S/P ratio ($R_{SP}$) can be calculated based on Expression 1 below where Ls is scotopic luminance, Lp is photopic luminance, $S(\lambda)$ is spectral radiant intensity of illumination light source 10, $V(\lambda)$ is spectral luminous efficiency with photopic vision, and $V'(\lambda)$ is spectral luminous efficiency with scotopic vision, for example.

[Math. 1]

$$R_{SP} = \frac{K' \int V'(\lambda)\Phi_e(\lambda)d\lambda}{K \int V(\lambda)\Phi_e(\lambda)d\lambda} \quad \text{Expression 1}$$

In Expression 1, K is a maximum photopic luminosity factor (=683), K' is a maximum scotopic luminosity factor (=1699), and $\Phi_e(\lambda)$ is a total spectral radiant flux of illumination light source 10.

Example 2

Figure 6:
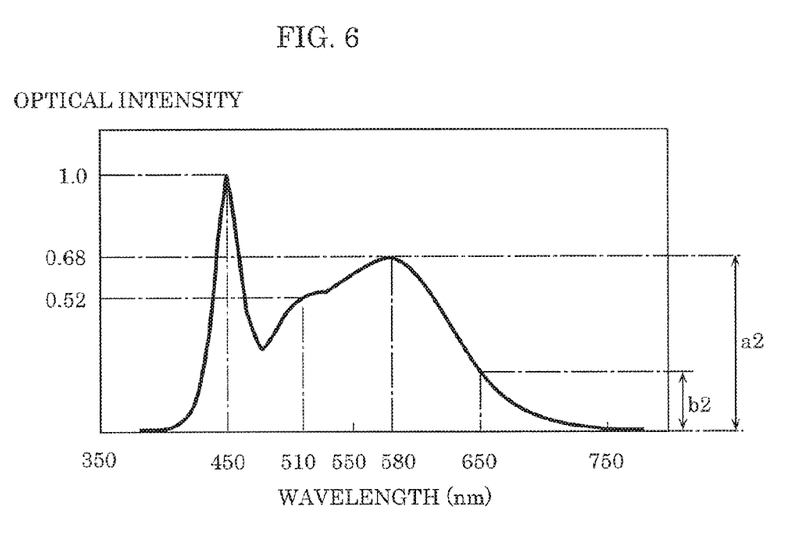
FIG. 6 illustrates a light emission spectrum of an illumination light source according to Example 2.

FIG. 6 illustrates a light emission spectrum of illumination light source 10 according to Example 2. Note that the vertical axis in FIG. 6 represents normalized optical intensity where light having a wavelength of 450 nm has optical intensity of 1.0 in the light emission spectrum.

Illumination light source 10 according to Example 2 is the same as illumination light source 10 according to Example 1 except that an amount of mixture of green phosphor 14a and red phosphor 14b is adjusted so that the white light emitted from illumination light source 10 has a correlated color temperature of 5500 K. Thus, the correlated color temperature of the white light which illumination light source 10 according to Example 2 emits is 5500 K.

As illustrated in FIG. 6, the proportion of the optical intensity at a wavelength of 510 nm relative to the optical intensity at the peak of the light emission spectrum (a wavelength of 450 nm) is 0.52, the proportion of the optical intensity at a wavelength of 580 nm relative to the optical intensity at the peak of the light emission spectrum is 0.68, and the proportion of the optical intensity at a wavelength of 650 nm relative to the optical intensity at the wavelength of 580 nm (b2/a2 in FIG. 6) is 0.35. Furthermore, the light emission spectrum of illumination light source 10 according to Example 2 has a second peak at the wavelength of 580 nm.

Average color rendering index Ra of the white light which illumination light source 10 according to Example 2 emits is 80. The S/P ratio of the white light which illumination light source 10 according to Example 2 emits is 2.1.

Example 3

Figure 7:
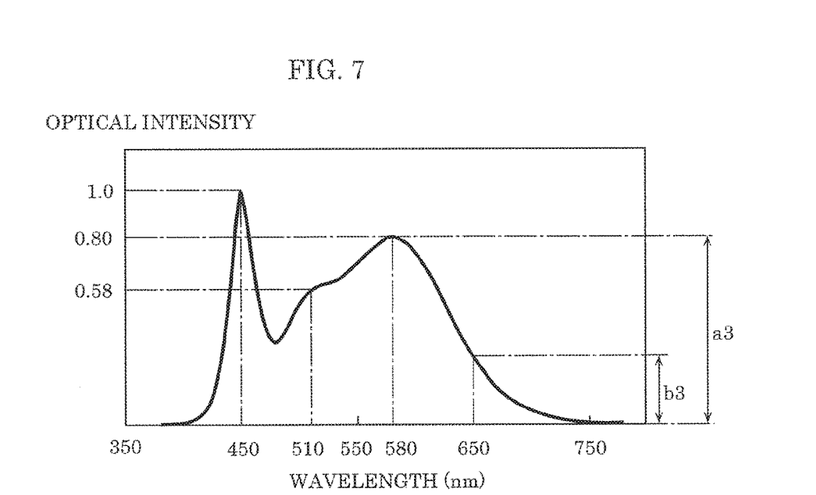
FIG. 7 illustrates a light emission spectrum of an illumination light source according to Example 3.

FIG. 7 illustrates a light emission spectrum of illumination light source 10 according to Example 3. Note that the vertical axis in FIG. 7 represents normalized optical intensity where light having a wavelength of 450 nm has optical intensity of 1.0 in the light emission spectrum.

Illumination light source 10 according to Example 3 is the same as illumination light source 10 according to Example 1 except that an amount of mixture of green phosphor 14a and red phosphor 14b is adjusted so that the white light emitted from illumination light source 10 has a correlated color temperature of 5000 K. Thus, the correlated color temperature of the white light which illumination light source 10 according to Example 3 emits is 5000 K.

As illustrated in FIG. 7, the proportion of the optical intensity at a wavelength of 510 nm relative to the optical intensity at the peak of the light emission spectrum (a wavelength of 450 nm) is 0.58, the proportion of the optical intensity at a wavelength of 580 nm relative to the optical intensity at the peak of the light emission spectrum is 0.80, and the proportion of the optical intensity at a wavelength of 650 nm relative to the optical intensity at the wavelength of 580 nm (b3/a3 in FIG. 7) is 0.37. The light emission spectrum of illumination light source 10 according to Example 3 has the second peak at the wavelength of 580 nm.

Average color rendering index Ra of the white light which illumination light source 10 according to Example 3 emits is 80. The S/P ratio of the white light which illumination light source 10 according to Example 3 emits is 2.0.

Comparative Example 1

Figure 8:
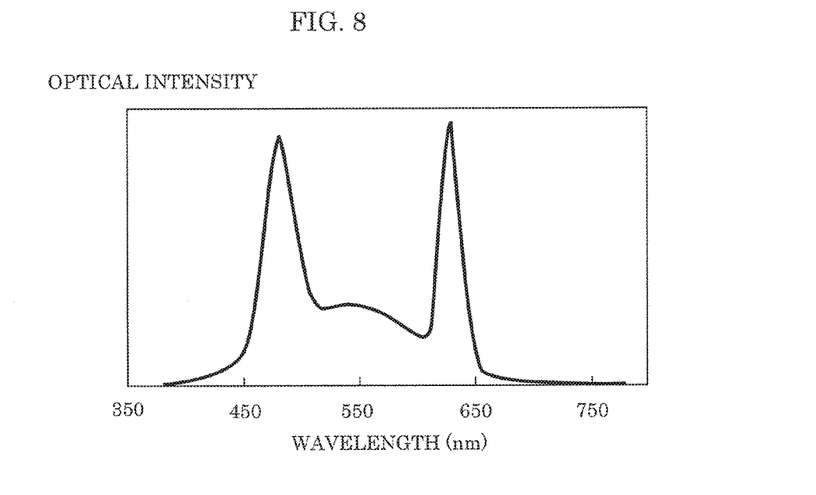
FIG. 8 illustrates a light emission spectrum of an illumination light source according to Comparative Example 1.

FIG. 8 illustrates a light emission spectrum of an illumination light source according to Comparative Example 1. The illumination light source according to Comparative Example 1 has the same configuration as the illumination light source used in the illumination apparatus disclosed in Japanese Unexamined Patent Application Publication No. 2013-101881.

The illumination light source according to Comparative Example 1 includes a blue green LED chip having a light emission peak at a wavelength of 480 nm, a red LED chip having a light emission peak at a wavelength of 630 nm, and a green phosphor ($Y_3Al_5O_{12}:Ce^{3+}$ phosphor) having a light emission peak at a wavelength of 555 nm. In the illumination light source according to Comparative Example 1, the number of blue green LED chips, the number of red LED chips, and the amount of the green phosphor are adjusted so that the white light emitted from the illumination light source has a correlated color temperature of 5500 K. Thus, the correlated color temperature of the white light which the illumination light source according to Comparative Example 1 emits is 5500 K.

The light emission spectrum of the white light which the illumination light source according to Comparative Example 1 emits has a characteristic such as that illustrated in FIG. 8. Average color rendering index Ra of the white light which the illumination light source according to Comparative Example 1 emits is 58. The S/P ratio of the white light which the illumination light source according to Comparative Example 1 emits is 2.9.

Comparative Example 2

Figure 9:
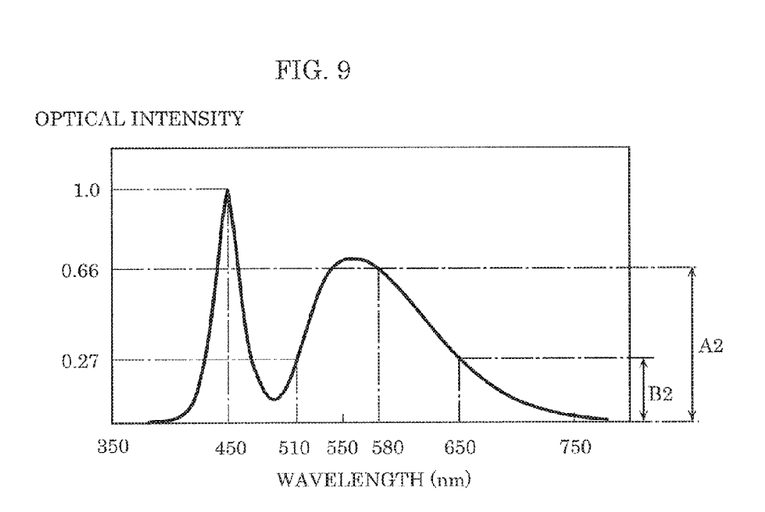
FIG. 9 illustrates a light emission spectrum of an illumination light source according to Comparative Example 2.

FIG. 9 illustrates a light emission spectrum of an illumination light source according to Comparative Example 2. Note that the vertical axis in FIG. 9 represents normalized optical intensity where light having a wavelength of 450 nm has optical intensity of 1.0 in the light emission spectrum.

The illumination light source according to Comparative Example 2 has the same overall configuration as illumination light source 10, but is different in the phosphor contained in the sealing member. Specifically, the illumination light source according to Comparative Example 2 includes an LED chip having a light emission peak at a wavelength of 450 nm, and a green phosphor ($Y_3Al_5O_{12}:Ce^{3+}$ phosphor) having a light emission peak at a wavelength of 555 nm. The illumination light source according to Comparative Example 2 does not include the red phosphor. In the illumination light source according to Comparative Example 2, an amount of mixture of the green phosphor is adjusted so that the white light emitted from the illumination light source has a correlated color temperature of 5000 K. Thus, the correlated color temperature of the white light which the illumination light source according to Comparative Example 2 emits is 5000 K.

As illustrated in FIG. 9, the proportion of the optical intensity at a wavelength of 510 nm relative to the optical intensity at the peak of the light emission spectrum (a wavelength of 450 nm) is 0.27, the proportion of the optical intensity at a wavelength of 580 nm relative to the optical intensity at the peak of the light emission spectrum is 0.66, and the proportion of the optical intensity at a wavelength of 650 nm relative to the optical intensity at the wavelength of 580 nm (B2/A2 in FIG. 9) is 0.40.

Average color rendering index Ra of the white light which the illumination light source according to Comparative Example 2 emits is 70. The S/P ratio of the white light which the illumination light source according to Comparative Example 2 emits is 1.7.

Comparative Example 3

Figure 10:
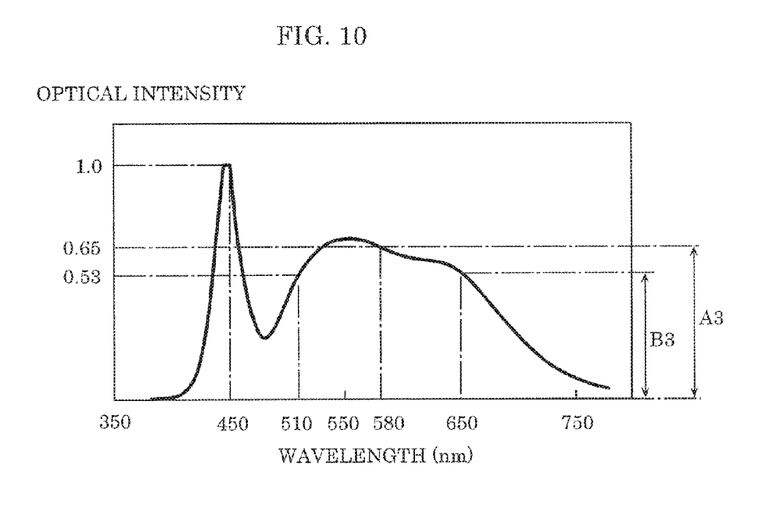
FIG. 10 illustrates a light emission spectrum of an illumination light source according to Comparative Example 3.

FIG. 10 illustrates a light emission spectrum of an illumination light source according to Comparative Example 3. Note that the vertical axis in FIG. 10 represents normalized optical intensity where light having a wavelength of 450 nm has optical intensity of 1.0 in the light emission spectrum.

In the illumination light source according to Comparative Example 3, the sealing member contains a red phosphor ((Sr, Ca)AlSiN$_3$:Eu$^{2+}$ phosphor) having a light emission peak at a wavelength of 615 nm, in addition to that contained in the sealing member of the illumination light source according to Comparative Example 2. In the illumination light source according to Comparative Example 3, an amount of mixture of the green phosphor and the red phosphor is adjusted so that the white light emitted from the illumination light source has a correlated color temperature of 5000 K. Thus, the correlated color temperature of the white light which the illumination light source according to Comparative Example 3 emits is 5000 K.

As illustrated in FIG. 10, the proportion of the optical intensity at a wavelength of 510 nm relative to the optical intensity at the peak of the light emission spectrum (a wavelength of 450 nm) is 0.53, the proportion of the optical intensity at a wavelength of 580 nm relative to the optical intensity at the peak of the light emission spectrum is 0.65, and the proportion of the optical intensity at a wavelength of 650 nm relative to the optical intensity at the wavelength of 580 nm (B3/A3 in FIG. 10) is 0.83.

Average color rendering index Ra of the white light which the illumination light source according to Comparative Example 3 emits is 90. The S/P ratio of the white light which the illumination light source according to Comparative Example 3 emits is 2.0. Photopic luminance of the white light which the illumination light source according to Comparative Example 3 emits is about 85% of photopic luminance of the white light which illumination light source 10 according to Example 1 emits.

Advantageous Effects, Etc.

Figure 11:
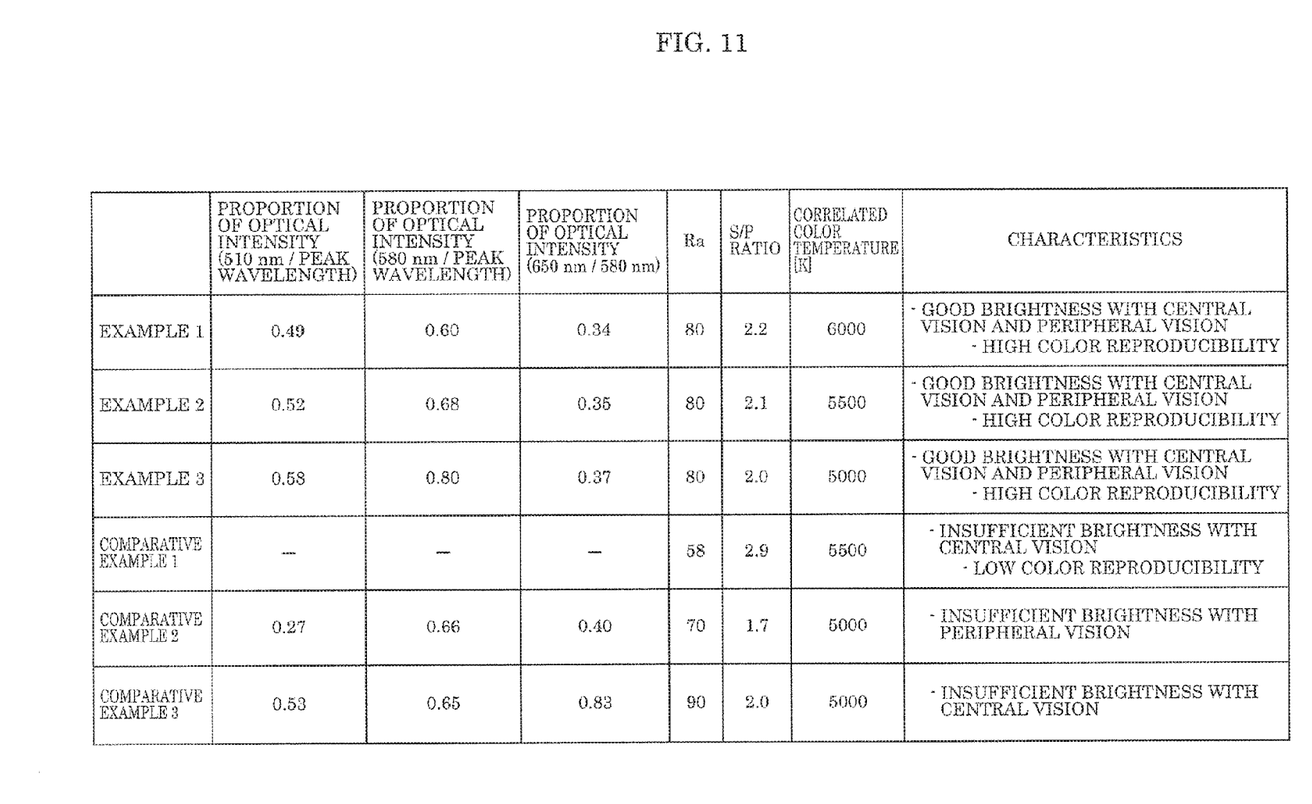
FIG. 11 is a table showing comparison of characteristics between illumination light sources according to Examples 1 to 3 and illumination light sources according to Comparative Examples 1 to 3.

Advantageous effects produced by illumination light sources 10 according to Examples 1 to 3 described above shall be described by comparison using Comparative Examples 1 to 3 described above. FIG. 11 is a table showing comparison of characteristics between illumination light sources 10 according to Examples 1 to 3 and illumination light sources according to Comparative Examples 1 to 3.

As illustrated in FIG. 11, each of the light emission spectra of the white light which illumination light sources 10 according to Examples 1 to 3 has a peak in the wavelength range from 430 nm to 460 nm. Furthermore, in the light emission spectra of the white light which illumination light sources 10 according to Examples 1 to 3 emit, the proportion of the optical intensity at a wavelength of 510 nm relative to the optical intensity at the peak is 0.45 or more, and the proportion of the optical intensity at a wavelength of 580 nm relative to the optical intensity at the peak is 0.60 or more. In the light emission spectra of the white light which illumination light sources 10 according to Examples 1 to 3 emit, the proportion of the optical intensity at a wavelength of 650 nm relative to the optical intensity at the wavelength of 580 nm is 0.4 or less.

In illumination light source 10 having a light emission spectrum that satisfies a condition such as that stated above, components of the blue green light in the wavelength range from 480 nm to 520 nm are increased so that the S/P ratio of the white light which illumination light source 10 emits can be increased. Specifically, the S/P ratio of the white light which illumination light source 10 emits can be 2.0 or more.

Of photoreceptor cells, a cone cell having a peak of spectral luminous efficiency at a wavelength of 555 nm is stimulated with photopic vision whereas, in addition to the cone cell, a rod cell having a peak of spectral luminous efficiency at a wavelength of 507 nm is stimulated under a mesopic environment such as night street spaces and night road spaces. In consideration of both the cone cell and the rod cell being stimulated under the mesopic environment, the S/P ratio of the white light which illumination light source 10 emits can be increased by increasing components of the blue green light in the wavelength range from 480 nm to 520 nm in the light emission spectrum.

Note that the S/P ratio is preferably 2.0 or more; light having the S/P ratio of 2.0 or more is perceived as bright particularly with peripheral vision. The peripheral vision means viewing a peripheral part of a field of view with a visual angle of 10 degrees or more, for example, and is active mainly under a mesopic environment (under a scotopic environment). Therefore, illumination light source 10 is capable of emitting white light that is perceived as bright with the peripheral vision under the mesopic environment.

Furthermore, illumination light source 10 having a light emission spectrum that satisfies a condition such as that stated above is capable of emitting white light that is perceived as bright also with central vision under the mesopic environment, due to a shape of the light emission spectrum. The central vision means viewing a central part of a field of view with a visual angle of 2 degrees or more and less than 10 degrees, for example, and is active mainly under a photopic environment.

In contrast, for example, the light emission spectrum of the illumination light source according to Comparative Example 3 does not satisfy the above-stated condition that the proportion of the optical intensity at a wavelength of 650 nm relative to the optical intensity at the wavelength of 580 nm is 0.4 or less. The illumination light source according to Comparative Example 3 is not capable of providing sufficient brightness both with central vision and with peripheral vision at the same time.

Likewise, the light emission spectrum of the illumination light source according to Comparative Example 1 does not satisfy the above-stated condition, either. Thus, the white light which the illumination light source according to Comparative Example 3 emits is insufficient in brightness with central vision under a mesopic environment.

Average color rendering index Ra of the white light which illumination light sources 10 according to Examples 1 to 3 emit is 70 or more, which indicates high color reproducibility. Therefore, illumination light sources 10 according to Examples 1 to 3 make it possible to reduce errors in color recognition.

In contrast, for example, average color rendering index Ra of the white light which the illumination light source according to Comparative Example 1 emits is 58, which indicates low color reproducibility; there is a risk of color recognition error.

Furthermore, the correlated color temperature of the white light which illumination light sources 10 according to Examples 1 to 3 emit is in the range from 4500 K to 7000 K.

With this, illumination light sources 10 according to Examples 1 to 3 are capable of emitting light of less bluish, natural daylight white (cool daylight color).

CONCLUSION

Illumination light source 10 according to Embodiment 1 is for use in at least one of an outdoor illumination apparatus and a vehicle headlight and includes LED chip 12 and a plurality of phosphors each of which is excited by light emitted from LED chip 12 and emits light having a wavelength different from a wavelength of the light emitted from LED chip 12. Illumination light source 10 emits white light resulting from mixing of the light emitted from LED chip 12 and the light emitted from the plurality of phosphors. A light emission spectrum of the white light has a peak in a wavelength range from 430 nm to 460 nm. In the light emission spectrum, a proportion of optical intensity at a wavelength of 510 nm relative to optical intensity at the peak is 0.45 or more, a proportion of optical intensity at a wavelength of 580 nm relative to the optical intensity at the peak is 0.60 or more, and a proportion of optical intensity at a wavelength of 650 nm relative to the optical intensity at the wavelength of 580 nm is 0.4 or less. A correlated color temperature of the white light is in the range from 4500 K to 7000 K, and average color rendering index Ha of the white light is 70 or more.

Illumination light source 10 just described is capable of emitting light that is perceived as bright both with peripheral vision and with central vision under a mesopic environment and has improved color reproducibility.

Furthermore, LED chip 12 may have a light emission peak in the wavelength range from 430 nm and 460 nm.

Thus, the use of LED chip 12 having a light emission peak in the wavelength range from 430 nm to 460 nm, for example, allows illumination light source 10 to emit light that is perceived as bright both with peripheral vision and with central vision and has improved color reproducibility.

Furthermore, the plurality of phosphors may include a $Lu_3Al_5O_{12}:Ce^{3+}$ phosphor having a center wavelength of fluorescence in the range from 540 nm to 550 nm.

Thus, the use of the $Lu_3Al_5O_{12}:Ce^{3+}$ phosphor having high light conversion efficiency in the blue green light range, for example, allows illumination light source 10 to efficiently emit light that is perceived as bright both with peripheral vision and with central vision and has improved color reproducibility.

Furthermore, the plurality of phosphors may include a (Sr, Ca)AlSiN$_3$:Eu$^{2+}$ phosphor having a center wavelength of fluorescence in the range from 610 nm to 620 nm.

Thus, the use of the (Sr, Ca)AlSiN$_3$:Eu$^{2+}$ phosphor, for example, allows illumination light source 10 to emit light that is perceived as bright both with peripheral vision and with central vision and has improved color reproducibility.

Furthermore, an S/P (scotopic/photopic) ratio of the white light, which is a ratio of scotopic luminance to photopic luminance, may be 2.0 or more.

Thus, illumination light source 10 is capable of emitting light having an S/P ratio of 2.0 or more.

Embodiment 2

Figure 12:
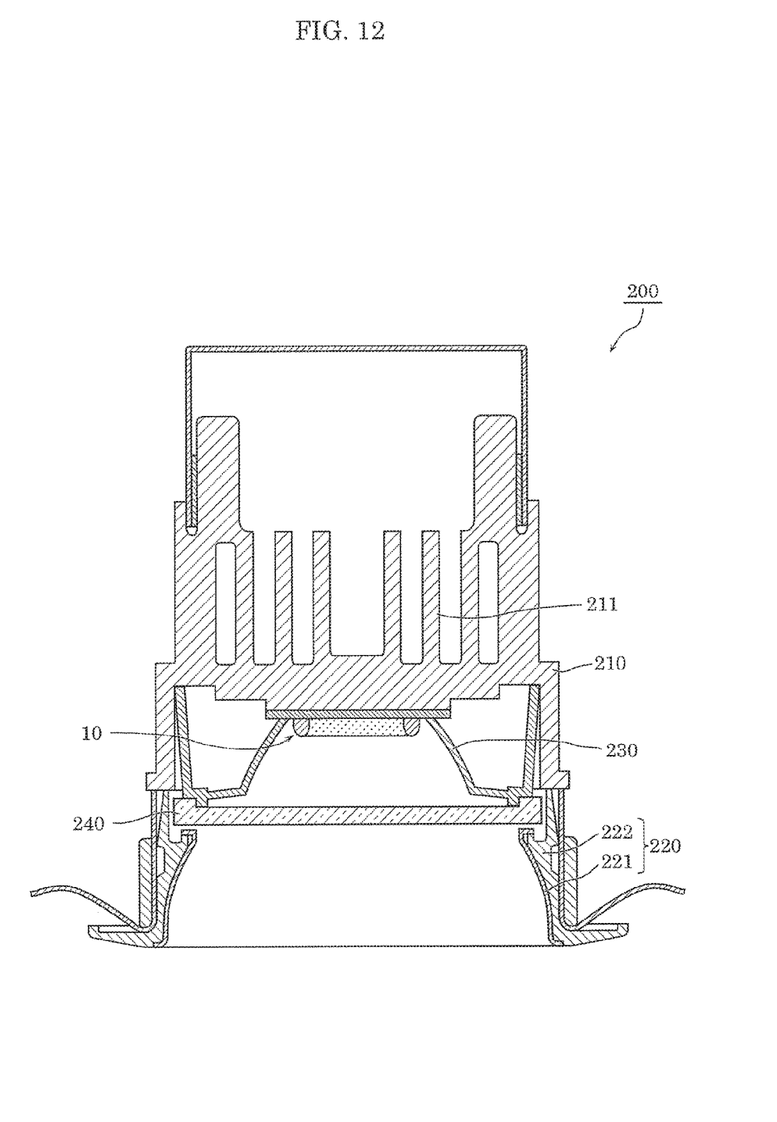
FIG. 12 is a cross-sectional view of an illumination apparatus according to Embodiment 2.
Figure 13:
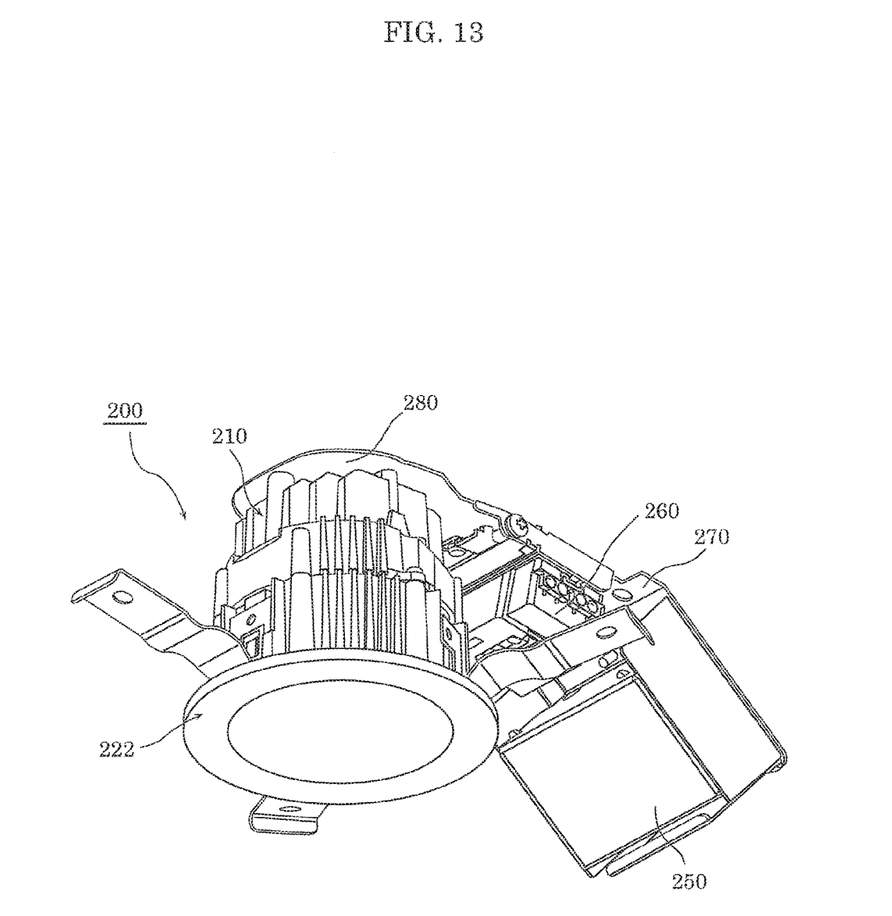
FIG. 13 is a perspective view of external appearances of an illumination apparatus and peripheral members thereof according to Embodiment 2.

In Embodiment 2, an illumination apparatus including an illumination light source according to Embodiment 1 is described. FIG. 12 is a cross-sectional view of an illumination apparatus according to Embodiment 2. FIG. 13 is a perspective view of external appearances of an illumination apparatus and peripheral members thereof according to Embodiment 2.

As illustrated in FIG. 12 and FIG. 13, illumination apparatus 200 according to Embodiment 2 is, for example, a recessed light for outdoor use that is embedded in the eaves, etc., of a house and emits light downward.

Illumination apparatus 200 includes illumination light source 10. Illumination apparatus 200 further includes an apparatus body in the shape of a substantial bottomed tube formed by joining pedestal 210 and frame 220, and reflection plate 230 and light-transmissive panel 240 disposed on this apparatus body.

Pedestal 210 is an attachment base to which illumination light source 10 is attached, and also serves as a heat sink for dissipating heat generated by illumination light source 10. Pedestal 210 is formed into a substantially columnar shape using a metal material and is, in Embodiment 2, made of die-cast aluminum.

Two or more heat-dissipating fins 211 are provided at predetermined intervals along one direction on the top portion (ceiling-side portion) of pedestal 210 so as to protrude upward. With this, heat generated by illumination light source 10 can be efficiently dissipated.

Frame 220 includes: cone portion 221 including a reflective surface on an inner surface and having a substantially circular tube shape; and frame body 222 to which cone portion 221 is attached. Cone portion 221 is formed using a metal material and can, for example, be formed of an aluminum alloy or the like by metal spinning or pressing. Frame body 222 is formed of a hard resin material or a metal material. Frame 220 is fixed by frame body 222 being attached to pedestal 210.

Reflection plate 230 is a circular-annular-frame-shaped (funnel-shaped) reflection member having an inner surface reflection function. For example, reflection plate 230 can be formed using a metal material such as aluminum. Note that reflection plate 230 may be formed using a hard white resin material instead of a metal material.

Light-transmissive panel 240 is a light-transmissive member having light-diffusing properties and light-transmitting properties. Light-transmissive panel 240 is a flat plate disposed between reflection plate 230 and frame 220, and is attached to reflection plate 230. For example, light-transmissive panel 240 can be formed into a disc shape using a transparent resin material such as acrylic or polycarbonate.

Note that illumination apparatus 200 is not required to include light-transmissive panel 240. Without light-transmissive panel 240, illumination apparatus 200 allows an improvement in the luminous flux of light that is emitted therefrom.

Furthermore, as illustrated in FIG. 13, lighting apparatus 250 which supplies illumination light source 10 with electric power for lighting illumination light source 10, and terminal base 260 which relays AC power from a commercial power supply to lighting apparatus 250 are connected to illumination apparatus 200. Specifically, lighting apparatus 250 converts AC power relayed by terminal base 260 into DC power, and outputs the DC power to illumination light source 10.

Lighting apparatus 250 and terminal base 260 are fixed to attachment plate 270 provided separately from the apparatus body. Attachment plate 270 is formed by folding a rectangular plate member made of a metal material, and has one longitudinal end the bottom surface of which lighting apparatus 250 is fixed to and the other longitudinal end the bottom surface of which terminal base 260 is fixed to. Attachment plate 270 is connected together with top plate 280 which is fixed to a top portion of pedestal 210 of the apparatus body.

As described above, illumination apparatus 200 includes illumination light source 10 and lighting apparatus 250 which supplies illumination light source 10 with electric power for lighting illumination light source 10. With this, illumination apparatus 200 is capable of emitting white light that is perceived as bright both with peripheral vision and with central vision and has improved color reproducibility.

OTHER EMBODIMENTS

Although the illumination light source and the illumination apparatus according to the embodiments have been described above, the present disclosure is not limited to the above-described embodiments.

Although the above-described light emission spectrum is obtained using two kinds of phosphors and one LED chip (light-emitting element) in the above embodiments, this is an exemplary method; any phosphor and light-emitting element that satisfy the above-stated condition may be used.

For example, although the center wavelength of the light emitted from the LED chip included in the illumination light source (the peak wavelength of the light emission spectrum) is 450 nm in Examples 1 to 3 described above, the center wavelength of the light emitted from the LED chip may be in the range from 430 nm to 460 nm.

Furthermore, for example, a semiconductor light-emitting element, such as a semiconductor laser, or another type of solid-state light-emitting element, such as an electroluminescence (EL) element including an organic or inorganic EL material, may be used as the light-emitting element. Furthermore, for example, the illumination light source may include three or more kinds of phosphor having different center wavelengths of fluorescence.

In both cases, when the above-stated condition of the light emission spectrum is satisfied, the illumination light source is capable of emitting light that can be perceived as bright both with peripheral vision and central vision.

Furthermore, although the illumination light source which emits the white light having a correlated color temperature of 5000 K or more is given as an example in Examples 1 to 3 of the above embodiment, the illumination light source is capable of emitting light of less bluish, natural daylight white (cool daylight color) when the correlated color temperature of the white light which the illumination light source emit is in the range from 4500 K to 7000 K.

Likewise, although the illumination light source which emits the white light having average color rendering index Ra of 80 or more is given as an example in Examples 1 to 3 of the above embodiment, it is possible to provide high color reproducibility and obtain the effect of reducing errors in color recognition when average color rendering index Ra of the white light which the illumination light source emits is 70 or more.

Furthermore, for example, although the above embodiment has described the illumination light source exemplified as a COB light-emitting module, the illumination light source according to the present disclosure may be implemented as a SMD (surface mount device) light-emitting element. Furthermore, the illumination light source according to the present disclosure may be implemented as a SMD light-emitting module including such a SMD light-emitting element. The SMD light-emitting element includes, for example, a resin container having a cavity, an LED chip mounted in the cavity, and a sealing member (phosphor-containing resin) filling the cavity.

Furthermore, the illumination light source according to the present disclosure may be implemented as a remote phosphor light-emitting module in which a resin member containing a phosphor is provided away from the LED chip.

Furthermore, the shape, structure, and size of the illumination light source according to the present disclosure are not particularly limited; the illumination light source according to the present disclosure only needs to satisfy the condition of the light emission spectrum described in the above embodiment.

Furthermore, in the above embodiments, the LED chip mounted on the substrate is connected to another LED chip in a chip-to-chip configuration by a bonding wire. However, the LED chip may be connected by a bonding wire to wiring (a metal film) provided on the substrate, and thus electrically connected to another LED chip via the wiring.

Figure 14:
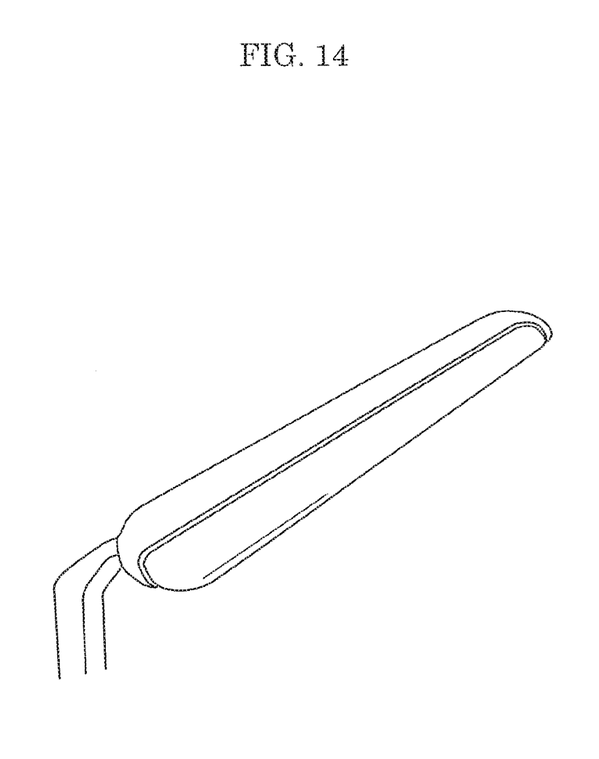
FIG. 14 illustrates another example of an illumination apparatus.

Furthermore, although the illumination apparatus is exemplified as a recessed light for outdoor use in the above embodiment, the present disclosure is particularly suitable for an illumination apparatus that is used in an environment with dark surroundings, such as outside at night. For example, the present disclosure may be implemented as an illumination apparatus for outdoor use, such as a street light (a security light or a road lamp) illustrated in FIG. 14, and may be implemented as a low pole light or a ground recessed illumination apparatus. Alternatively, the present disclosure may be implemented as an on-vehicle illumination apparatus such as a vehicle headlight.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. An illumination light source comprising:
   a light-emitting element; and
   a plurality of phosphors each of which is excited by light emitted from the light-emitting element and emits light having a wavelength different from a wavelength of the light emitted from the light-emitting element,
   wherein the illumination light source emits white light resulting from mixing of the light emitted from the light-emitting element and the light emitted from the plurality of phosphors,
   a light emission spectrum of the white light has a peak in a wavelength range from 430 nm to 460 nm,
   in the light emission spectrum,
      a proportion of optical intensity at a wavelength of 510 nm relative to optical intensity at the peak is 0.45 or more,
      a proportion of optical intensity at a wavelength of 580 nm relative to the optical intensity at the peak is 0.60 or more, and
      a proportion of optical intensity at a wavelength of 650 nm relative to the optical intensity at the wavelength of 580 nm is 0.4 or less,
   a correlated color temperature of the white light is in a range from 4500 K to 7000 K, and an average color rendering index Ra of the white light is 70 or more.

2. The illumination light source according to claim 1, wherein the light-emitting element has a light emission peak in the wavelength range from 430 nm to 460 nm.

3. The illumination light source according to claim 1, wherein one of the plurality of phosphors has a center wavelength of fluorescence in a range from 540 nm to 550 nm.

4. The illumination light source according to claim 1, wherein the plurality of phosphors include a $Lu_3Al_5O_{12}:Ce^{3+}$ phosphor having a center wavelength of fluorescence in a range from 540 nm to 550 nm.

5. The illumination light source according to claim 1, wherein one of the plurality of phosphors has a center wavelength of fluorescence in a range from 610 nm to 620 nm.

6. The illumination light source according to claim 1, wherein the plurality of phosphors include a $(Sr,Ca)AlSiN_3:Eu^{2+}$ phosphor having a center wavelength of fluorescence in a range from 610 nm to 620 nm.

7. The illumination light source according to claim 1, wherein an S/P (scotopic/photopic) ratio of the white light is 2.0 or more, the S/P ratio being a ratio of scotopic luminance to photopic luminance.

8. The illumination light source according to claim 2, wherein a plurality of light-emitting elements are provided, each of the plurality of light-emitting elements being the light-emitting element having the light emission peak in the wavelength range from 430 nm to 460 nm.

9. The illumination light source according to claim 8, wherein only the plurality of light-emitting elements having the light emission peak in the wavelength range from 430 nm to 460 nm are provided as a light-emitting element.

10. An illumination apparatus comprising:

the illumination light source according to claim 1; and a lighting apparatus that supplies the illumination light source with electric power for lighting the illumination light source.

11. An outdoor illumination apparatus comprising:

the illumination light source according to claim 1; and a housing accommodating the illumination light source.

12. A vehicle headlight, comprising:

the illumination light source according to claim 1; and a lighting apparatus that supplies the illumination light source with electric power for causing the illumination light source to emit light.

\* \* \* \* \*